(12) United States Patent
Lee et al.

(10) Patent No.: US 8,383,983 B2
(45) Date of Patent: Feb. 26, 2013

(54) SUBSTRATE CUTTING APPARATUS AND METHOD OF CUTTING SUBSTRATE USING THE SAME

(75) Inventors: Hyun-Chul Lee, Yongin (KR);
Cheol-Lee Roh, Yongin (KR);
Gyoo-Wan Han, Yongin (KR);
Seung-Ho Myoung, Yongin (KR);
Jong-Heon Kim, Yongin (KR);
Joon-Hyung Kim, Yongin (KR);
Sung-Gon Kim, Yongin (KR); Yong-Jin Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 291 days.

(21) Appl. No.: 12/731,410

(22) Filed: Mar. 25, 2010

(65) Prior Publication Data

US 2010/0243628 A1    Sep. 30, 2010

(30) Foreign Application Priority Data

Mar. 25, 2009    (KR) .................... 10-2009-0025451

(51) Int. Cl.
*B23K 26/14* (2006.01)
*B23K 26/16* (2006.01)
*B23K 26/00* (2006.01)

(52) U.S. Cl. ......... 219/121.72; 219/121.67; 219/121.68; 219/121.69; 219/121.85

(58) Field of Classification Search ............ 219/121.67, 219/121.68, 121.69, 121.72, 121.85
See application file for complete search history.

(56) References Cited

U.S. PATENT DOCUMENTS

| | | | |
|---|---|---|---|
| 5,254,833 A | 10/1993 | Okiyama | |
| 5,902,368 A * | 5/1999 | Witzmann et al. | 65/105 |
| 6,529,264 B1 * | 3/2003 | Ikeda | 355/53 |
| 6,770,544 B2 * | 8/2004 | Sawada | 438/462 |
| 7,015,118 B2 * | 3/2006 | Wakayama | 438/460 |
| 7,169,688 B2 * | 1/2007 | Liu | 438/463 |
| 7,388,172 B2 * | 6/2008 | Sercel et al. | 219/121.72 |
| 7,423,237 B2 * | 9/2008 | Kusama et al. | 219/121.72 |
| 7,566,636 B2 * | 7/2009 | Nakadate et al. | 438/462 |
| 7,601,616 B2 * | 10/2009 | Morikazu et al. | 438/463 |
| 7,605,058 B2 * | 10/2009 | Nakamura | 438/464 |
| 7,633,034 B2 * | 12/2009 | Bruland et al. | 219/121.68 |
| 7,638,729 B2 * | 12/2009 | Park | 219/121.67 |
| 7,649,157 B2 * | 1/2010 | Iizuka | 219/121.82 |
| 7,767,555 B2 * | 8/2010 | Park | 438/463 |
| 7,804,043 B2 * | 9/2010 | Deshi | 219/121.67 |
| 7,838,796 B2 * | 11/2010 | Furui | 219/121.72 |

(Continued)

FOREIGN PATENT DOCUMENTS

| | | |
|---|---|---|
| CN | 1541800 | 11/2004 |
| JP | 57-181787 | 11/1982 |

(Continued)

OTHER PUBLICATIONS

U.S. Appl. No. 12/731,305, filed Mar. 25, 2010, Hyun-Chul Lee et al., Samsung Mobile Display Co., Ltd.

*Primary Examiner* — Ida M Soward
(74) *Attorney, Agent, or Firm* — Lee & Morse, P.C.

(57) ABSTRACT

A substrate cutting apparatus including: a stage to support a substrate; a laser generator to emit a laser beam; a beam oscillator to oscillate the laser beam onto a cutting line of the substrate, to heat the substrate; and a cooling unit to cool the heated substrate.

22 Claims, 6 Drawing Sheets

U.S. PATENT DOCUMENTS

| | | | |
|---|---|---|---|
| 7,887,712 B2 * | 2/2011 | Boyle et al. | 216/65 |
| 8,108,998 B2 * | 2/2012 | Inada et al. | 29/890.1 |
| 2001/0035400 A1 * | 11/2001 | Gartner et al. | 219/121.72 |
| 2003/0034093 A1 * | 2/2003 | Morris et al. | 148/197 |
| 2007/0125458 A1 * | 6/2007 | Kawasaki et al. | 148/414 |
| 2007/0164072 A1 * | 7/2007 | Nishio | 225/93.5 |
| 2007/0228100 A1 * | 10/2007 | Gonoe | 225/1 |
| 2007/0228616 A1 * | 10/2007 | Bang | 264/405 |
| 2008/0035617 A1 * | 2/2008 | Fu et al. | 219/121.69 |
| 2008/0061043 A1 * | 3/2008 | Fujii | 219/121.69 |
| 2008/0286943 A1 * | 11/2008 | Nishio | 438/460 |
| 2008/0305615 A1 * | 12/2008 | Ueno et al. | 438/463 |
| 2009/0046757 A1 * | 2/2009 | Miyairi et al. | 372/101 |
| 2009/0135702 A1 * | 5/2009 | Usami et al. | 369/100 |
| 2009/0219499 A1 | 9/2009 | Yamaguchi et al. | |
| 2009/0230102 A1 * | 9/2009 | Soyama | 219/121.69 |
| 2010/0034982 A1 * | 2/2010 | Fuwa | 427/554 |

FOREIGN PATENT DOCUMENTS

| | | |
|---|---|---|
| JP | 02303695 A * | 12/1990 |
| JP | 07251284 A * | 10/1995 |
| JP | 11-021141 | 1/1999 |
| JP | 2001-321978 | 11/2001 |
| JP | 2005-212364 | 8/2005 |
| JP | 2005-314127 | 11/2005 |
| JP | 2006162877 A * | 6/2006 |
| JP | 2008-080346 | 4/2008 |
| JP | 2008-132616 | 6/2008 |
| KR | 20-0262793 Y1 | 1/2002 |
| KR | 10-0347955 B1 | 7/2002 |
| TW | 578266 | 3/2004 |
| WO | WO-03013816 A1 | 2/2003 |
| WO | WO-2004-002705 A1 | 1/2004 |

* cited by examiner ations.

SUBSTRATE CUTTING APPARATUS AND METHOD OF CUTTING SUBSTRATE USING THE SAME

CROSS-REFERENCE TO RELATED APPLICATION

This application claims priority to and the benefit of Korean Patent Application No. 10-2009-0025451, filed in the Korean Intellectual Property Office on Mar. 25, 2009, the disclosure of which is incorporated herein, by reference.

BACKGROUND

1. Field

The described technology relates generally to a substrate cutting apparatus and a method of cutting a substrate using the same.

2. Description of the Related Art

A substrate cutting apparatus is used to cut a glass-based, base substrate of a flat panel display into a desired product size. Flat panel displays include organic light emitting diode (OLED) displays, liquid crystal displays (LCD), and the like. A flat panel display is advantageous, due to having a thin profile, such that the demand therefore is gradually increasing. In recent years, there has been an increasing demand for a flat panel display including a glass substrate having a thickness of 0.3 mm or less.

In general, a substrate cutting apparatus is equipped with a $CO_2$ laser and a cooling device, in order to cut a transparent glass substrate. That is, the substrate cutting apparatus instantly heats the glass substrate along a cutting line, using the $CO_2$ laser, thereby generating compression stress. Then the apparatus instantly cools the heated portion using the cooling device, thereby generating tensile stress. If such thermal stress is applied to the glass substrate, micro-cracks are generated, thereby causing the glass substrate to be cut.

However, the thinner the glass substrate the more difficult it is to smoothly generate such micro-cracks. This principle is the reason why a thinner glass container is less likely to be broken by hot water than a thicker glass container. Accordingly, a conventional substrate cutting apparatus is problematic, in that it cannot easily cut relatively thinner glass substrates of a flat panel display.

The above information disclosed in this Background section is only for enhancement of understanding of the background of the described technology, and therefore, it may contain information that does not constitute prior art.

SUMMARY

Additional aspects and/or advantages of the present teachings will be set forth in part in the description which follows and, in part, will be obvious from the description, or may be learned by practice of the present teachings.

The described technology has been made in an effort to provide a substrate cutting apparatus that can effectively and stably cut a thin glass substrate.

The present teachings further provide a substrate cutting method using the substrate cutting apparatus.

A substrate cutting apparatus, according to an exemplary embodiment of the present teachings, includes: a stage to support a substrate; a laser generator to emit a laser beam, to heat the substrate along a cutting line; a beam oscillator disposed on a beam path of the laser beam, to oscillate the laser beam along the cutting line; and a cooling unit to cool the heated substrate.

According to various embodiments, the beam oscillator may oscillate the laser beam in a predetermined irradiation section of the cutting line. The length of the irradiation section may be less than the length of the cutting line.

According to various embodiments, the irradiation section may have a length of 100 mm or less.

According to various embodiments, the beam oscillator may oscillate the laser beam in the irradiation section, at from about 0.1 m/s to about 10 m/s.

According to various embodiments, the thermal profile of the substrate in the irradiation section may have two or more distinct ridges.

According to various embodiments, the substrate cutting apparatus may further include a transfer unit to transfer one of the beam oscillator and the stage with respect to the other, such that the irradiation section is moved along the cutting line.

According to various embodiments, the cooling unit may cool a rear (trailing) edge of the irradiation section, and a difference in the temperature between the upper and lower surface regions of the heated substrate, immediately before the cooling, may be at least about 50° C.

According to various embodiments, the beam oscillator may include a reflector to reflect the laser beam, and a driver to drive the reflector.

According to various embodiments, the driver may selectively control the motion of the reflector, such that the speed at which the laser beam is oscillated is varied non-uniformly.

According to various embodiments, the laser generator may be a $CO_2$ laser.

According to various embodiments, the substrate may have a thickness of less than about 0.3 mm and may be made of a glass-based material.

Another exemplary embodiment provides a substrate cutting method including: mounting a substrate on a stage; oscillating a laser beam along a cutting line of the substrate, to heat a region of the substrate; and cooling the heated region of the substrate, to cut the substrate along the cutting line.

According to various embodiments, the laser beam may be oscillated within an irradiation section of the cutting line, the length of the irradiation section being smaller than the length of the cutting line.

According to various embodiments, the irradiation section may have a length of less than about 100 mm.

According to various embodiments, the laser beam may be oscillated on the cutting line, at from about 0.1 m/s to about 10 m/s.

According to various embodiments, the thermal profile of irradiation section may have a two or more distinct ridges, and the ridges may have different patterns.

According to various embodiments, the oscillating and the cooling may further comprise transferring one of a beam oscillator and the stage relative to the other, to move the irradiation section along the cutting line.

According to various embodiments, the rear edge of the beam irradiation section may be cooled, and a difference in temperature between upper and lower surface regions of the substrate immediately before the cooling may be more than about 50° C.

According to various embodiments, the laser beam may be formed by a $CO_2$ laser.

According to various embodiments, the substrate may have a thickness of less than about 0.3 mm.

BRIEF DESCRIPTION OF THE DRAWINGS

These and/or other aspects and advantages of the present teachings will become apparent and more readily appreciated from the following description of the exemplary embodiments, taken in conjunction with the accompanying drawings, of which.

DETAILED DESCRIPTION

Figure 1:
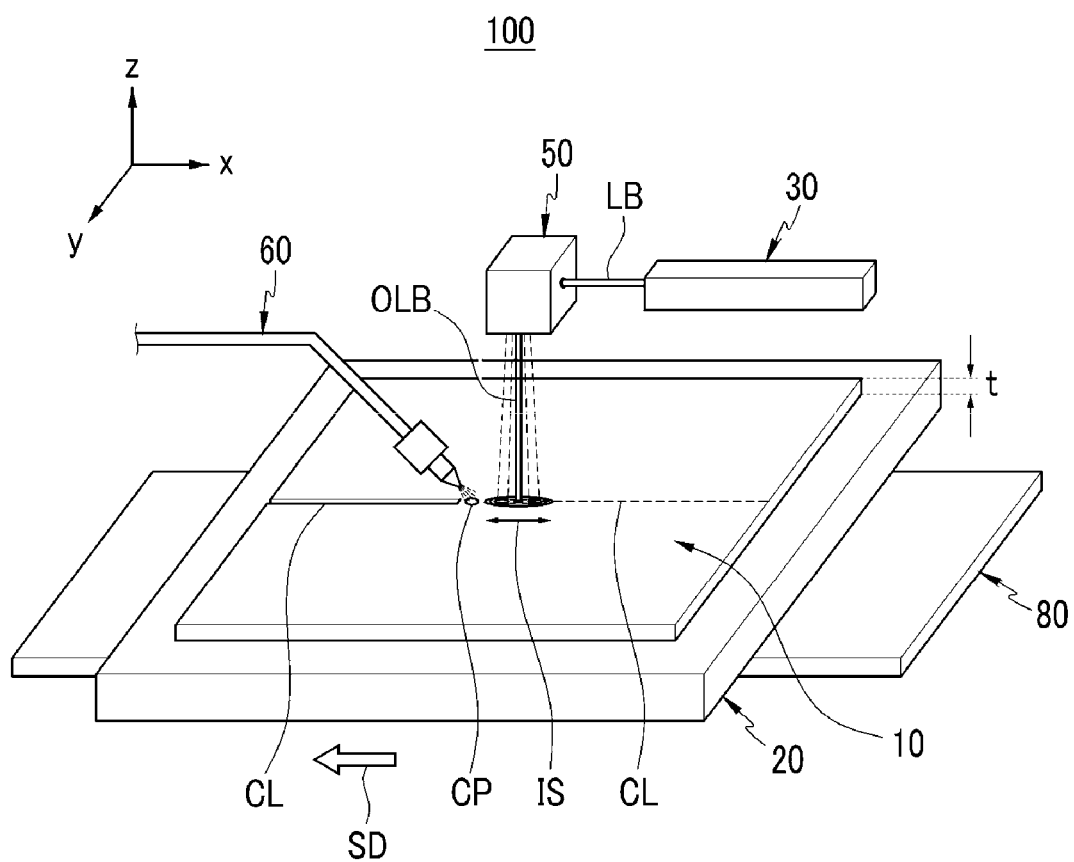
FIG. 1 is perspective view of a substrate cutting apparatus, according to an exemplary embodiment of the present teachings.

Reference will now be made in detail to the exemplary embodiments of the present teachings, examples of which are illustrated in the accompanying drawings, wherein like reference numerals refer to the like elements throughout. The exemplary embodiments are described below, in order to explain aspects of the present teachings, by referring to the figures. As those skilled in the art would realize, the described embodiments may be modified in various different ways, all without departing from the spirit or scope of the present invention. Further, the size and thickness of each of the elements shown in the drawings are arbitrarily shown for better understanding and ease of description, and the present invention is not necessarily limited thereto.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween.

Hereinafter, a substrate cutting apparatus 100, according to an exemplary embodiment of the present teachings, is described with reference to FIG. 1. As shown in FIG. 1, the substrate cutting apparatus 100 includes a stage 20, a laser generator 30, a beam oscillator 50, a cooling unit 60, and a transfer unit 80.

The stage 20 supports a substrate 10 to be cut. For example, the substrate 10 may be made of a glass-based material. However, the substrate 10 is not so limited and may be a substrate made of a transparent non-metallic material other than glass, for example. The substrate 10 is mounted on the stage 20 and cut along a cutting line CL. In FIG. 1, the dotted portion of the cutting line CL refers to an uncut portion of the cutting line CL, and the solid portion of the cutting line CL refers to a cut portion of the cutting line CL.

The laser generator 30 emits a laser beam LB to heat the substrate 10 along the cutting line CL. The laser generator 30 may be an infrared-based laser, such as a $CO_2$ laser, for example. The $CO_2$ laser can emit a laser beam having a wavelength of about 10,600 nm. Such a laser beam is well absorbed into water molecules or hydroxy groups, and thus, has a high absorption in glass. The laser generator 30 is not so limited, however, and may be any laser that can emit a laser beam having a wavelength of about 780 nm or more.

The beam oscillator 50 is disposed on the beam path of the laser beam LB. The beam oscillator 50 oscillates the laser beam LB along the cutting line CL, thereby forming an oscillated laser beam OLB on the substrate 10. The beam oscillator 50 oscillates the laser beam LB, by minutely changing a tilt angle of the LB with respect to the substrate 10. That is, the oscillated laser beam OLB is oscillated within a predetermined irradiation section IS (portion of the cutting line CL), by the beam oscillator 50. The irradiation section IS extends along a portion of the cutting line CL. Here, the tilt angle refers to an angle at which the oscillated laser beam OLB is incident on the surface of the substrate 10. That is, the oscillating of the tilt angle of the oscillated laser beam OLB with respect to the substrate 10 refers to the change in the angle at which the laser beam LB is incident to the substrate 10. Accordingly, the angle at which the oscillated laser beam OLB is incident to the surface of the substrate 10 varies within a predetermined range. Further, the oscillated laser beam OLB is oscillated along the length of the cutting line CL, within the irradiation section IS.

The oscillated laser beam OLB heats the substrate 10 along the cutting line CL, within the irradiation section IS. That is, the oscillated laser beam OLB forms a beam spot on the substrate 10 that reciprocates in a straight line, within the irradiation section (IS).

Figure 2:
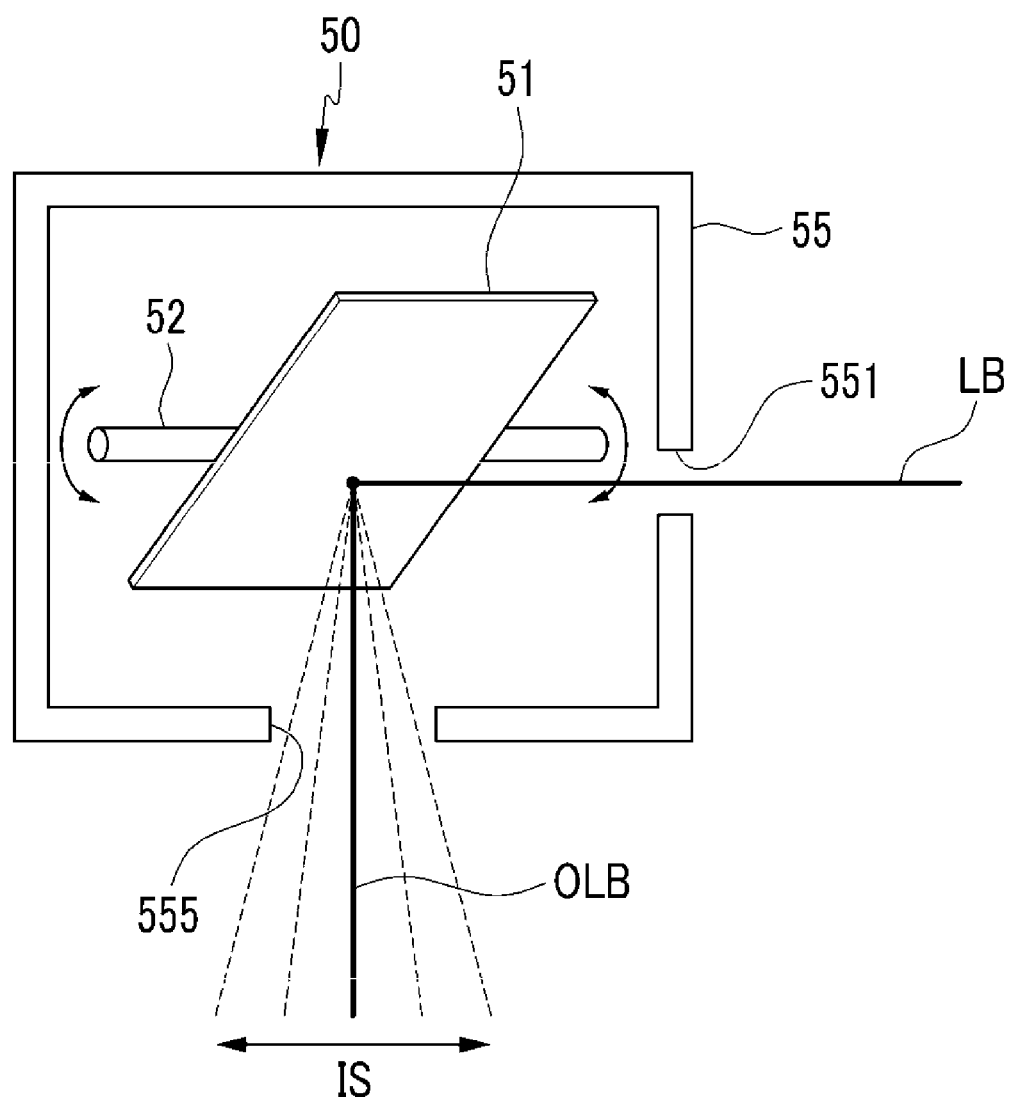
FIG. 2 is a schematic diagram showing a beam oscillator of FIG. 1.

The beam oscillator 50, as shown in FIG. 2, includes a reflector 51 to reflect the laser beam LB emitted from the laser generator 30, and a driver 52 to drive the reflector 51. The driver 52 may further include elements, such as a motor and a controller, which are not shown in FIG. 2. The driver 52 oscillates the reflector 51 to form the oscillated laser beam OLB. Here, the driver 52 may selectively control the motion of the reflector 51, such that speed of the oscillated laser beam OLB does not move at a uniform speed along the cutting line CL. That is, the driver 52 may vary the speed of the reflector 51, in a non-uniform manner.

The beam oscillator 50 may further include a casing 55 to house the reflector 51 and the driver 52. The casing 55 includes a beam inflow port 551, through which the laser beam LB emitted from the laser generator 30 passes into the casing 55, and a beam irradiation port 555 through which the oscillated laser beam OLB is projected toward the substrate 10 by the reflector 51 and the driver 52 (refer to FIG. 1). The swing width of the oscillated laser beam OLB can be controlled by controlling the size of the beam irradiation port 555.

Although not shown, the beam oscillator 50 may further include a lens that is disposed in the beam irradiation port 555, to focus the oscillated laser beam OLB within the irradiation section IS. However, the beam oscillator 50 is not limited to the structure shown in FIG. 2. In other words, any suitable type of beam oscillator may be used.

Referring back to FIG. 1, the transfer unit 80 transfers the stage 20 in a direction SD, which is parallel to the cutting line CL. That is, the irradiation section IS can be moved along the cutting line CL, by the transfer unit 80. However, according to some embodiments, the transfer unit 80 may move the beam oscillator 50 and the laser generator 30, rather than the stage 20.

The cooling unit 60 cools a portion of the substrate 10 that has been heated by the oscillated laser beam OLB. In more detail, the cooling unit 60 cools the rear (trailing) edge CP of the irradiation section (IS), on the basis of a moving direction (i.e., the X-axis direction) of the irradiation section IS.

The operation of the substrate cutting apparatus 100, according to an exemplary embodiment of the present teachings, is described below. First, the oscillated laser beam OLB heats the substrate 10 within the irradiation section IS, along the cutting line CL. At this time, compression stress caused by the heat occurs in the irradiation section IS. The irradiation section IS moved along the cutting line CL by the transfer unit 80.

The cooling unit 60 rapidly cools the rear edge CP of the irradiation section IS. Accordingly, thermal stress occurs at the cooled rear edge CP, thereby cutting the cutting line CL.

As described above, the thermal stress, caused by the sudden change in the temperature is applied to the substrate 10, results in the formation of micro-cracks in the substrate 10. The micro-cracks cause the substrate 10 to be cut along the cutting line CL. However, with the decreased thickness of the substrate 10, a sudden change in the temperature between the upper and lower surface regions of the substrate 10 is difficult to produce, as heat is rapidly dissipated by the thin substrate 10. Consequently, micro-cracks may not be formed in a desired direction, or may not be stably generated.

However, in an exemplary embodiment, since the oscillated laser beam (OLB) heats the substrate 10 in the irradiation section IS, the substrate 10 can be effectively and stably cut, even though the substrate 10 has a relatively thin thickness of 0.3 mm or less. However, the present teaching are not limited to such a thickness, as the substrate cutting apparatus 100 can be used to cut thicker substrates.

Figure 3:
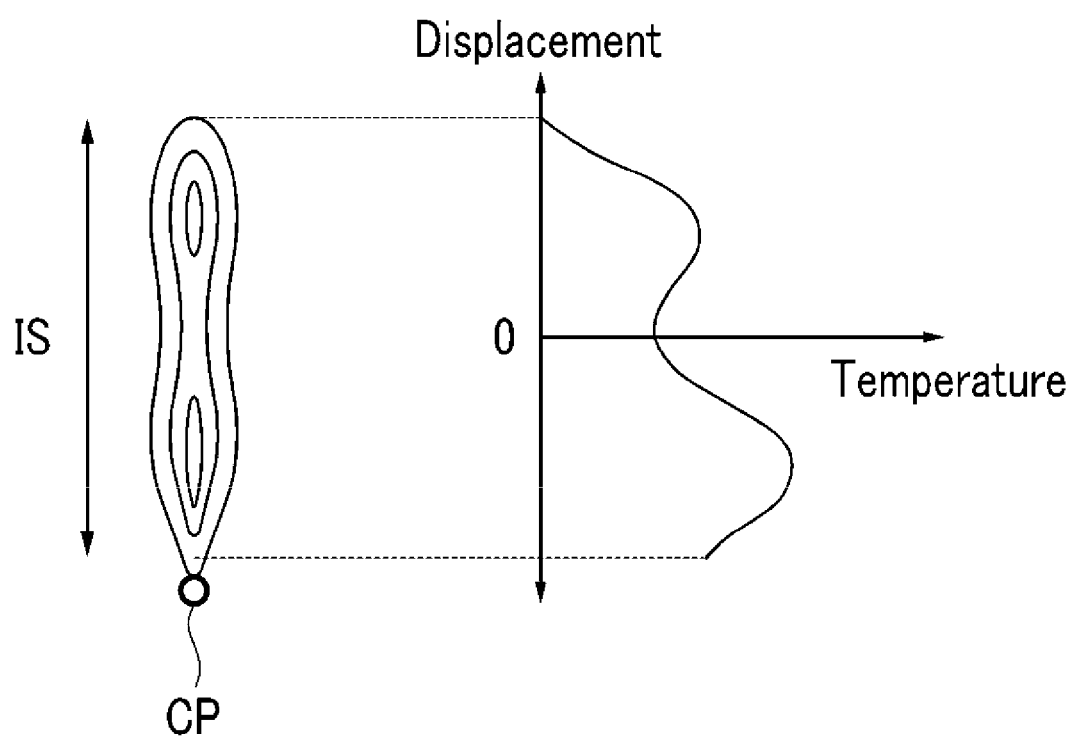
FIGS. 3 to 6 are graphs showing the thermal profiles of an irradiation section and a temperature distribution of a substrate, according to an exemplary embodiment of the present teachings and a comparative example.

This is because a thermal profile of the substrate 10 in the irradiation section IS has two ridges, as shown in FIG. 3. Here, the two ridges have different temperature profiles. As can be seen from the thermal profile shown in FIG. 3, the temperature distribution of the irradiation section IS is very complicated and non-uniform. During the heating and cooling processes, greater thermal stress (compression and expansion stresses) is generated in the substrate 10. Accordingly, a glass-based substrate having a thickness of 0.3 mm or less can be effectively and stably cut along the cutting line CL.

However, the present teachings are not limited to the thermal profile illustrated in FIG. 3. For example, in the irradiation section IS, the thermal profile may have a multi-ridge pattern including three or more ridges. Increasing the number of ridges of the thermal profile increases the thermal stress of the substrate 10, which can allow for more effective cutting. Further, the driver 52 of the beam oscillator 50 can increase the number of ridges of the thermal profile, by controlling the motion of the reflector 51.

According to some aspects, the irradiation section IS may have a length of less than about 100 mm. If the length of the irradiation section IS is more than about 100 mm, it may be difficult form an appropriate the thermal profile, because it is more difficult to increase the average temperature and maximum temperature of the irradiation section IS, using the oscillated laser beam OLB.

Further, the beam oscillator 50 oscillates the oscillated laser beam OLB at a speed of from about 0.1 m/s and 10 m/s. That is, the oscillated laser beam OLB forms a beam spot that reciprocates linearly, at the speed of from about 0.1 m/s to 10 m/s, within the irradiation section IS. Outside of this range, the above-described thermal profile may be difficult to obtain.

In addition, a difference in the temperature between the upper and lower surface regions of the heated substrate 10, immediately before the cooling by the cooling unit 60, may preferably be about 50° C. or more. That is, the substrate 10 is generally cooled when a difference in the temperature between the upper and lower surface regions of the substrate 10 is at least about 50° C. This is because, as a difference in the temperature between the upper and lower surface regions of the substrate 10 increases, thermal stress resulting from the cooling increases. The substrate cutting apparatus 100 can cut the substrate 10 effectively and stably.

Figure 4:
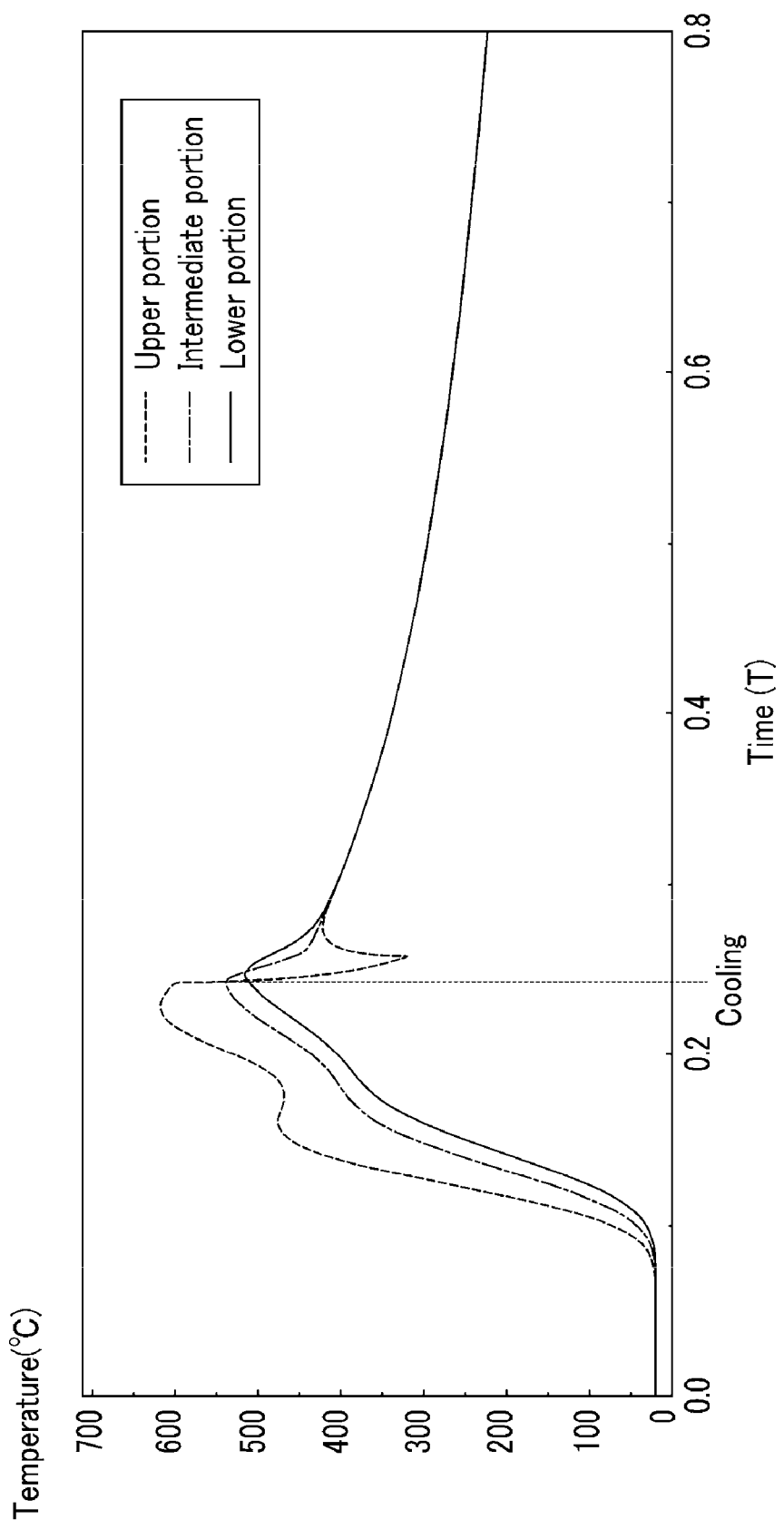

Hereinafter, an experimental example, according to the exemplary embodiment of the present teachings, and a comparative example are described with reference to FIGS. 1 and 3-6. In the experimental example, since the irradiation section IS is heated by the oscillated laser beam OLB, the thermal profile of the irradiation section IS has the two-ridge pattern, as shown in FIG. 3. Further, a difference in the temperature between the upper and lower portions of the heated irradiation section (IS) increases, when the substrate 10 is cooled as shown in FIG. 4.

If the rear edge CP of the irradiation section IS is suddenly cooled, when the above-described thermal profile is obtained, more thermal stress is applied to the substrate 10. Accordingly, the substrate 10 can be cut effectively and stably along the cutting line CL.

Figure 5:
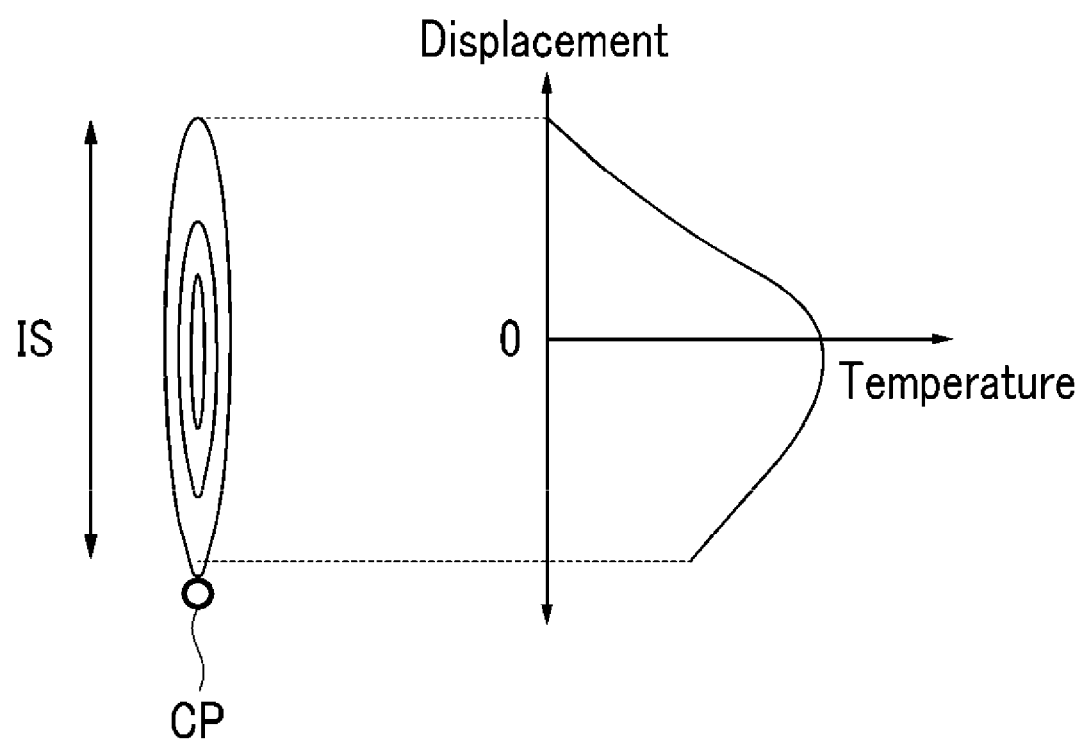
Figure 6:
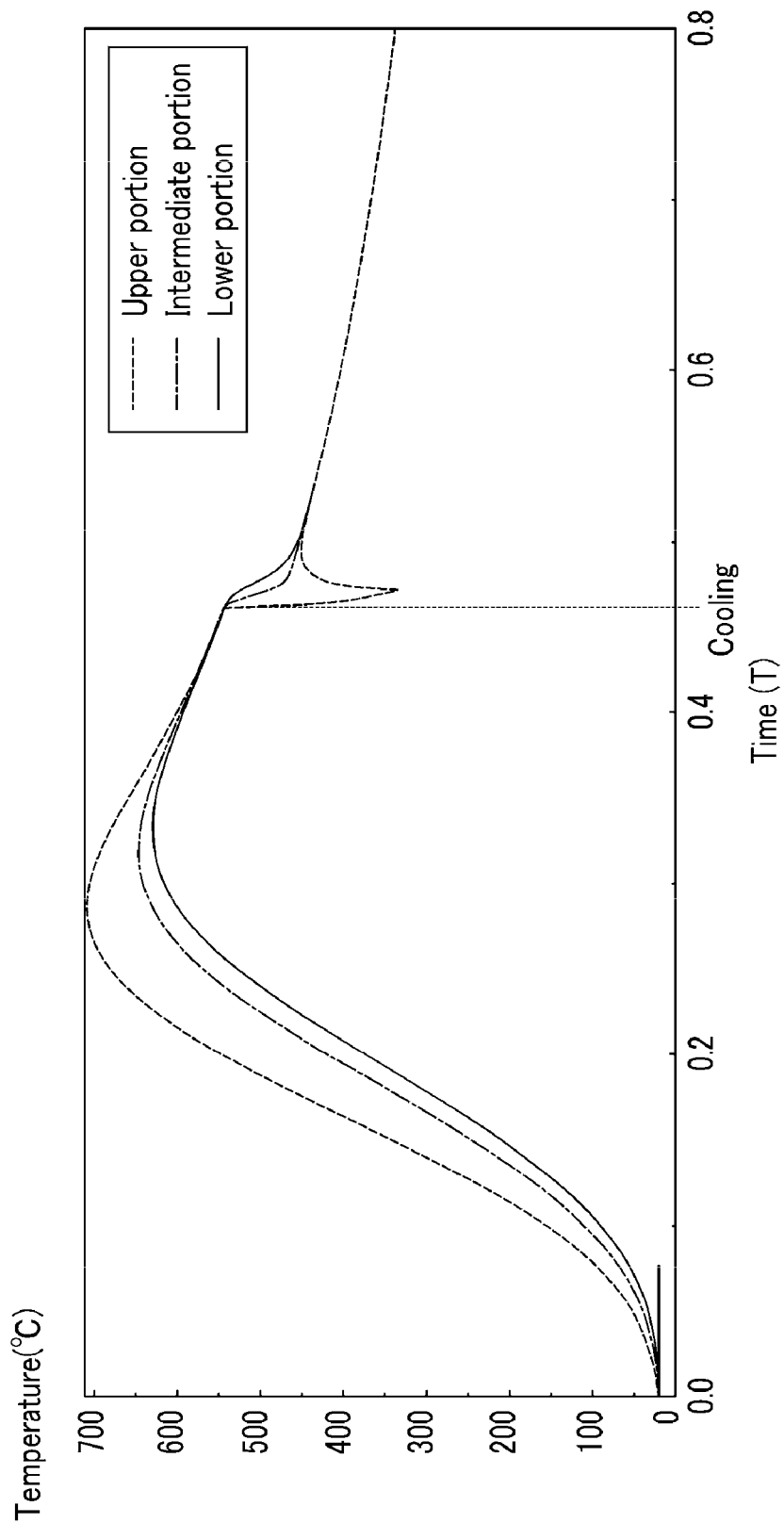

On the other hand, in the comparative example, since the substrate 10 is directly heated by a general, non-oscillated laser beam LB, a thermal profile of the comparative irradiation section IS has a single ridge pattern, as shown in FIG. 5. Further, a difference in the temperature between the upper and lower portions of the comparative irradiation section IS is very small when the substrate 10 is cooled, as shown in FIG. 6.

If the rear edge (CP) of the comparative irradiation section (IS) is suddenly cooled, in the state in which the above thermal profile is obtained, less thermal stress applied to the substrate 10, as compared with the experimental example.

From the above description, it can be seen that the comparative example has a poor ability to stably cut the substrate 10, as compared with the experimental example. In particular, it can be expected that, in the comparative example, a substrate having a relatively thin thickness of 0.3 mm or less will not be easily cut. The comparison of the experimental example and the comparative example reveals that the substrate cutting apparatus 100, according to the exemplary embodiment, can cut the substrate 10 effectively and stably.

A method of cutting the substrate 100 using the substrate cutting apparatus 100 of FIG. 1 is described below. First, the glass substrate 10 is mounted on the stage 20.

Next, part of the substrate 10 is heated by the oscillated laser beam OLB, which is oscillated by minutely oscillating the tilt angle of the oscillated laser beam OLB with respect to the substrate 10, along the cutting line CL. Here, the oscillated laser beam OLB is generated by a $CO_2$ laser. Further, the oscillated laser beam OLB reciprocates linearly within the irradiation section IS, along the cutting line CL, within the irradiation section IS.

Further, the irradiation section IS has a length of about 100 mm or less, and the speed at which the laser beam OLB oscillates on the substrate 10 ranges from about 0.1 m/s to 10 m/s. Moreover, the thermal profile of the heated irradiation section IS has a multi-ridge pattern.

Next, the irradiation section IS is moved along the cutting line CL. The rear edge CP of the irradiation section IS, with respect to the direction of the movement, is cooled by the cooling unit 60. At this time, a difference in the temperatures of the upper and lower portions of the substrate 10, immediately before the cooling, is 50° C. or more.

If, as described above, the substrate 10 is heated by the oscillated laser beam OLB and is then abruptly cooled, micro-cracks are generated in the substrate 10 by thermal stress, so the substrate 10 can be stably cut along the cutting line CL. Through such a substrate cutting method, the substrate 10 can be cut more effectively and stably.

Although a few exemplary embodiments of the present teachings have been shown and described, it would be appreciated by those skilled in the art that changes may be made in these exemplary embodiments, without departing from the principles and spirit of the present teachings, the scope of which is defined in the claims and their equivalents.

What is claimed is:
1. A substrate cutting apparatus, comprising:
   a stage to support a substrate;

a laser generator to emit a laser beam and form a beam spot on the substrate;

a beam oscillator disposed on a beam path of the laser beam, to oscillate the laser beam such that the beam spot reciprocates in a direction along a cutting line of the substrate, so as to heat a portion of the substrate; and a cooling unit to cool the heated portion of the substrate.

2. The substrate cutting apparatus of claim 1, wherein the beam oscillator oscillates the laser beam to reciprocate the beam spot within an irradiation section of the cutting line, the irradiation section having a length that is less than a length of the cutting line.

3. The substrate cutting apparatus of claim 2, wherein the length of the irradiation section is less than about 100 mm.

4. The substrate cutting apparatus of claim 2, wherein the beam oscillator oscillates the laser beam to reciprocate the beam spot within the irradiation section at from about 0.1 m/s to about 10 m/s.

5. The substrate cutting apparatus of claim 2, wherein a thermal profile of the irradiation section has two or more unique ridges.

6. The substrate cutting apparatus of claim 2, further comprising a transfer unit to move one of the beam oscillator and the stage relative to the other, such that the irradiation section is moved along the cutting line.

7. The substrate cutting apparatus of claim 6, wherein:
the cooling unit cools a trailing edge of the irradiation section; and
a difference in temperature between upper and lower surface regions of the trailing edge, immediately before the cooling, is at least about 50° C.

8. The substrate cutting apparatus of claim 2, wherein the beam oscillator includes:
a reflector to reflect the laser beam emitted from the laser generator; and
a driver to drive the reflector.

9. The substrate cutting apparatus of claim 8, wherein the driver selectively controls the motion of the reflector, such that the speed at which the laser beam is oscillated is varied non-uniformly.

10. The substrate cutting apparatus of claim 1, wherein the laser generator includes a $CO_2$ laser.

11. The substrate cutting apparatus of claim 1, wherein the apparatus is configured to cut a substrate having a thickness of less than about 0.3 mm and being formed of a glass-based material.

12. A substrate cutting method, comprising:
mounting a substrate on a stage;
oscillating a laser beam to reciprocate a beam spot along a cutting line of the substrate, to heat a portion of the substrate; and
cooling the heated portion of the substrate, to cut the substrate along the cutting line.

13. The substrate cutting method of claim 12, wherein the laser beam is oscillated to reciprocate the beam spot in an irradiation section of the cutting line, the irradiation section having a length that is less than a length of the cutting line.

14. The substrate cutting method of claim 13, wherein the length of the irradiation section is less than about 100 mm.

15. The substrate cutting method of claim 13, wherein the laser beam is oscillated to reciprocate the beam spot in the irradiation section at from about 0.1 m/s to about 10 m/s.

16. The substrate cutting method of claim 13, wherein a thermal profile of the irradiation section has two or more unique ridges.

17. The substrate cutting method of claim 13, wherein the method further comprises moving one of a beam oscillator and the stage relative to the other, to move the irradiation section along the cutting line during the oscillating of the laser beam and the cooling of the heated portion of the substrate.

18. The substrate cutting method of claim 17, wherein:
the cooling includes cooling a trailing edge of the irradiation section; and
a difference in temperature between upper and lower surface regions of the trailing edge, immediately before the cooling, is at least about 50° C.

19. The substrate cutting method of claim 12, wherein the laser beam is produced by a $CO_2$ laser generator.

20. The substrate cutting method of claim 12, wherein the substrate has a thickness of less than about 0.3 mm and is formed of a glass-based material.

21. The substrate cutting apparatus of claim 1, wherein the beam oscillator oscillates the laser beam by changing a tilt angle of the laser beam with respect to the substrate.

22. The substrate cutting method of claim 12, wherein the oscillating of the laser beam includes changing a tilt angle of the laser beam with respect to the substrate.

* * * * *